United States Patent
Chang et al.

(10) Patent No.: US 8,769,802 B1
(45) Date of Patent: Jul. 8, 2014

(54) METHOD OF FABRICATION AN ULTRA-THIN QUARTZ RESONATOR

(75) Inventors: David T. Chang, Calabasas, CA (US); Randall L. Kubena, Oak Park, CA (US); Pamela R. Patterson, Los Angeles, CA (US)

(73) Assignee: HRL Laboratories, LLC, Malibu, CA (US)

( * ) Notice: Subject to any disclaimer, the term of this patent is extended or adjusted under 35 U.S.C. 154(b) by 23 days.

(21) Appl. No.: 12/831,028

(22) Filed: Jul. 6, 2010

Related U.S. Application Data

(62) Division of application No. 12/034,852, filed on Feb. 21, 2008, now Pat. No. 7,802,356.

(51) Int. Cl.
*H04R 31/00* (2006.01)

(52) U.S. Cl.
USPC ........... 29/594; 29/25.35; 29/609.1; 310/321; 381/396

(58) Field of Classification Search
CPC ............. H03H 3/02; H03H 3/04; H03H 3/10; H03H 9/19; H03H 9/132; H03H 9/172; G04F 5/063
USPC ...... 29/592.1–595, 609.1, 600, 601; 310/321–328, 330, 331, 311–313; 451/5, 41; 438/459; 381/396–398; 181/171–172
See application file for complete search history.

(56) References Cited

U.S. PATENT DOCUMENTS

| | | | |
|---|---|---|---|
| 392,650 A | 11/1888 | Watrous | |
| 2,487,165 A | 11/1949 | Miller | 310/363 |
| 3,390,287 A | 6/1968 | Hans | 310/329 |
| 3,766,616 A | 10/1973 | Staudte | |
| 4,364,016 A | 12/1982 | Tanski | |
| 4,426,769 A | 1/1984 | Grabbe | |
| 4,442,574 A | 4/1984 | Wanuga et al. | |
| 4,447,753 A * | 5/1984 | Ochiai | 310/312 |
| 4,618,262 A | 10/1986 | Maydan et al. | 356/357 |
| 4,870,313 A | 9/1989 | Hirama et al. | 310/320 |

(Continued)

FOREIGN PATENT DOCUMENTS

| | | |
|---|---|---|
| DE | 4442033 | 5/1996 |
| DE | 19719601 | 11/1998 |

(Continued)

OTHER PUBLICATIONS

Sirbuly, Donald J. et al., Multifunctional Nanowire Evanescent Wave Optical Sensors, Advanced Materials, 2007 (published online: Dec. 5, 2006), 19, pp. 61-66.

(Continued)

*Primary Examiner* — Minh Trinh
(74) *Attorney, Agent, or Firm* — Ladas & Parry

(57) ABSTRACT

A method for manufacturing a resonator is presented in the present application. The method includes providing a handle substrate, providing a host substrate, providing a quartz substrate comprising a first surface opposite a second surface, applying interposer film to the first surface of the quartz substrate, bonding the quartz substrate to the handle substrate wherein the interposer film is disposed between the quartz substrate and the handle substrate, thinning the second surface of the quartz substrate, removing a portion of the bonded quartz substrate to expose a portion of the interposer film, bonding the quartz substrate to the host substrate, and removing the handle substrate and the interposer film, thereby releasing the quartz substrate.

3 Claims, 5 Drawing Sheets

(56) References Cited

U.S. PATENT DOCUMENTS

| | | | |
|---|---|---|---|
| 4,898,031 A | 2/1990 | Oikawa et al. | |
| 4,944,836 A | 7/1990 | Beyer et al. | 156/645 |
| 5,203,208 A | 4/1993 | Bernstein | |
| 5,226,321 A | 7/1993 | Varnham et al. | |
| 5,260,596 A | 11/1993 | Dunn et al. | |
| 5,421,312 A | 6/1995 | Dawson | |
| 5,480,747 A | 1/1996 | Vasudev | 430/5 |
| 5,530,408 A | 6/1996 | Vig et al. | 331/69 |
| 5,552,016 A | 9/1996 | Ghanayem | 156/999.999 |
| 5,578,976 A | 11/1996 | Yao et al. | |
| 5,589,724 A | 12/1996 | Satoh et al. | 310/348 |
| 5,604,312 A | 2/1997 | Lutz | |
| 5,605,490 A | 2/1997 | Laffey et al. | |
| 5,644,139 A | 7/1997 | Allen | |
| 5,646,346 A | 7/1997 | Okada | |
| 5,648,849 A | 7/1997 | Canteloup et al. | 356/357 |
| 5,658,418 A | 8/1997 | Coronel et al. | 156/345 |
| 5,665,915 A | 9/1997 | Kobayashi et al. | |
| 5,666,706 A | 9/1997 | Tomita et al. | |
| 5,668,057 A | 9/1997 | Eda et al. | 438/113 |
| 5,728,936 A | 3/1998 | Lutz | |
| 5,783,749 A | 7/1998 | Lee et al. | |
| 5,894,090 A | 4/1999 | Tang et al. | |
| 5,905,202 A | 5/1999 | Kubena et al. | |
| 5,920,012 A | 7/1999 | Pinson | |
| 5,928,532 A | 7/1999 | Koshimizu et al. | 219/121.42 |
| 5,942,445 A | 8/1999 | Kato et al. | 438/691 |
| 5,959,206 A | 9/1999 | Ryrko | |
| 5,981,392 A | 11/1999 | Oishi | 438/691 |
| 5,987,985 A | 11/1999 | Okada | |
| 6,009,751 A | 1/2000 | Ljung | |
| 6,044,705 A | 4/2000 | Neukermans et al. | |
| 6,049,702 A | 4/2000 | Tham | 455/78 |
| 6,081,334 A | 6/2000 | Grimbergen et al. | 356/357 |
| 6,094,985 A | 8/2000 | Kapels et al. | |
| 6,114,801 A | 9/2000 | Tanaka et al. | |
| 6,145,380 A | 11/2000 | MacGugan et al. | |
| 6,151,964 A | 11/2000 | Nakajima | |
| 6,155,115 A | 12/2000 | Ljung | |
| 6,164,134 A | 12/2000 | Cargille | |
| 6,182,352 B1 | 2/2001 | Deschenes et al. | |
| 6,196,059 B1 | 3/2001 | Kosslinger | |
| 6,204,737 B1 | 3/2001 | Ella | |
| 6,207,008 B1 | 3/2001 | Kijima | 216/2 |
| 6,236,145 B1 | 5/2001 | Biernacki | |
| 6,250,157 B1 | 6/2001 | Touge | |
| 6,263,552 B1 | 7/2001 | Takeuchi et al. | |
| 6,282,958 B1 | 9/2001 | Fell et al. | |
| 6,289,733 B1 | 9/2001 | Challoner et al. | |
| 6,297,064 B1 | 10/2001 | Koshimizu | 438/9 |
| 6,349,597 B1 | 2/2002 | Folkmer et al. | |
| 6,367,326 B1 | 4/2002 | Okada | |
| 6,367,786 B1 | 4/2002 | Gutierrez et al. | |
| 6,413,682 B1 | 7/2002 | Shibano et al. | 430/5 |
| 6,417,925 B1 | 7/2002 | Naya | 356/445 |
| 6,424,418 B2 | 7/2002 | Kawabata et al. | 356/445 |
| 6,426,296 B1 | 7/2002 | Okojie | 438/692 |
| 6,432,824 B2 | 8/2002 | Yanagisawa | 438/691 |
| 6,481,284 B2 | 11/2002 | Geen et al. | |
| 6,481,285 B1 | 11/2002 | Shkel et al. | |
| 6,492,195 B2 | 12/2002 | Nakanishi | |
| 6,513,380 B2 | 2/2003 | Reeds et al. | |
| 6,514,767 B1 | 2/2003 | Natan | 436/166 |
| 6,515,278 B2 | 2/2003 | Wine et al. | |
| 6,571,629 B1 | 6/2003 | Kipp | |
| 6,584,845 B1 | 7/2003 | Gutierrez et al. | |
| 6,614,529 B1 | 9/2003 | Tang | 356/381 |
| 6,621,158 B2 | 9/2003 | Martin et al. | |
| 6,627,067 B1 | 9/2003 | Branton et al. | 205/778 |
| 6,628,177 B2 | 9/2003 | Clark et al. | |
| 6,629,460 B2 | 10/2003 | Challoner | |
| 6,651,027 B2 | 11/2003 | McCall | |
| 6,710,681 B2 | 3/2004 | Figueredo | 333/187 |
| 6,715,352 B2 | 4/2004 | Tracy | |
| 6,744,335 B2 | 6/2004 | Ryhanen | |
| 6,750,728 B2 | 6/2004 | Takahashi et al. | |
| 6,756,304 B1 | 6/2004 | Robert | 438/667 |
| 6,768,396 B2 | 7/2004 | Klee | 333/187 |
| 6,796,179 B2 | 9/2004 | Bae et al. | |
| 6,806,557 B2 | 10/2004 | Ding | |
| 6,815,228 B2 | 11/2004 | Usui et al. | 438/14 |
| 6,856,217 B1 | 2/2005 | Clark et al. | |
| 6,862,398 B2 | 3/2005 | Elkind et al. | 356/445 |
| 6,883,374 B2 | 4/2005 | Fell et al. | |
| 6,915,215 B2 | 7/2005 | M'Closkey et al. | |
| 6,933,164 B2 | 8/2005 | Kubena | 438/49 |
| 6,943,484 B2 | 9/2005 | Clark et al. | |
| 6,985,051 B2 | 1/2006 | Nguyen et al. | |
| 7,057,331 B2 | 6/2006 | Shimodaira et al. | 310/344 |
| 7,118,657 B2 | 10/2006 | Golovchenko et al. | 204/192.3 |
| 7,152,290 B2 | 12/2006 | Junhua et al. | |
| 7,168,318 B2 | 1/2007 | Challoner et al. | |
| 7,211,933 B2 | 5/2007 | Kawakubo | |
| 7,224,245 B2 | 5/2007 | Song | 333/133 |
| 7,232,700 B1 | 6/2007 | Kubena | 438/51 |
| 7,234,214 B2 | 6/2007 | Xu | |
| 7,237,315 B2 | 7/2007 | Kubena et al. | 29/25.35 |
| 7,295,088 B2 | 11/2007 | Nguyen | |
| 7,317,354 B2 | 1/2008 | Lee | |
| 7,446,628 B2 | 11/2008 | Morris, III | |
| 7,459,099 B2 | 12/2008 | Kubena et al. | 216/57 |
| 7,459,992 B2 | 12/2008 | Matsuda et al. | |
| 7,479,846 B2 | 1/2009 | Inoue | 333/133 |
| 7,490,390 B2 | 2/2009 | Kawakubo et al. | |
| 7,543,496 B2 | 6/2009 | Ayazi | |
| 7,551,054 B2 | 6/2009 | Mizuno | 336/200 |
| 7,555,824 B2 | 7/2009 | Chang | |
| 7,557,493 B2 | 7/2009 | Fujimoto | 310/349 |
| 7,559,130 B2 | 7/2009 | Kubena et al. | 29/594 |
| 7,564,177 B2 | 7/2009 | Yoshimatsu | 310/365 |
| 7,579,748 B2 | 8/2009 | Kuroda | 310/312 |
| 7,579,926 B2 | 8/2009 | Jhung | 333/133 |
| 7,581,443 B2 | 9/2009 | Kubena | |
| 7,663,196 B2 | 2/2010 | Liu | 257/416 |
| 7,671,427 B2 | 3/2010 | Kim et al. | |
| 7,675,224 B2 | 3/2010 | Tanaya | |
| 7,690,095 B2 * | 4/2010 | Takahashi | 29/25.35 |
| 7,750,535 B2 | 7/2010 | Kubena | |
| 7,757,393 B2 | 7/2010 | Ayazi et al. | |
| 7,791,432 B2 | 9/2010 | Piazza et al. | 333/186 |
| 7,802,356 B1 * | 9/2010 | Chang et al. | 29/594 |
| 7,830,074 B2 | 11/2010 | Kubena | |
| 7,872,548 B2 | 1/2011 | Nishihara et al. | |
| 7,884,930 B2 | 2/2011 | Kirby | |
| 7,895,892 B2 | 3/2011 | Aigner | |
| 7,994,877 B1 | 8/2011 | Kubena | |
| 8,138,016 B2 | 3/2012 | Chang | |
| 8,151,640 B1 | 4/2012 | Kubena | |
| 8,176,607 B1 | 5/2012 | Kubena | |
| 8,522,612 B1 | 9/2013 | Kubena | |
| 2002/0066317 A1 | 6/2002 | Lin | |
| 2002/0072246 A1 | 6/2002 | Goo et al. | 438/782 |
| 2002/0074947 A1 | 6/2002 | Tsukamoto | 315/169.3 |
| 2002/0107658 A1 | 8/2002 | McCall | |
| 2002/0185611 A1 | 12/2002 | Menapace et al. | 65/392 |
| 2003/0003608 A1 | 1/2003 | Arikado et al. | 257/618 |
| 2003/0010123 A1 | 1/2003 | Malvern et al. | |
| 2003/0029238 A1 | 2/2003 | Challoner | |
| 2003/0196490 A1 | 10/2003 | Cardarelli | |
| 2003/0205948 A1 | 11/2003 | Lin | 310/312 |
| 2004/0055380 A1 | 3/2004 | Shcheglov et al. | |
| 2004/0065864 A1 | 4/2004 | Vogt et al. | 51/308 |
| 2004/0189311 A1 | 9/2004 | Glezer | |
| 2004/0211052 A1 | 10/2004 | Kubena et al. | |
| 2005/0034822 A1 | 2/2005 | Kim et al. | |
| 2005/0062368 A1 | 3/2005 | Hirasawa | |
| 2005/0093659 A1 | 5/2005 | Larson | 333/191 |
| 2005/0156309 A1 | 7/2005 | Fuji | |
| 2005/0260792 A1 | 11/2005 | Patel | |
| 2006/0016065 A1 | 1/2006 | Nagaura | 310/361 |
| 2006/0022556 A1 | 2/2006 | Bail et al. | 310/344 |
| 2006/0055479 A1 | 3/2006 | Okazaki et al. | 331/158 |
| 2006/0066419 A1 | 3/2006 | Iwaki | 333/133 |
| 2006/0139121 A1 | 6/2006 | Jhung | 333/133 |

(56) References Cited

U.S. PATENT DOCUMENTS

| | | | |
|---|---|---|---|
| 2006/0197619 A1 | 9/2006 | Oishi et al. | 331/158 |
| 2006/0213266 A1 | 9/2006 | French | |
| 2006/0252906 A1 | 11/2006 | Godschalx et al. | 528/86 |
| 2007/0017287 A1 | 1/2007 | Kubena | |
| 2007/0034005 A1 | 2/2007 | Acar | |
| 2007/0205839 A1 | 9/2007 | Kubena et al. | 331/158 |
| 2007/0220971 A1 | 9/2007 | Ayazi | |
| 2007/0240508 A1 | 10/2007 | Watson | |
| 2008/0034575 A1 | 2/2008 | Chang et al. | 29/594 |
| 2008/0074661 A1 | 3/2008 | Zhang | 356/301 |
| 2008/0096313 A1 | 4/2008 | Patel | |
| 2008/0148846 A1 | 6/2008 | Whelan | |
| 2009/0146527 A1 | 6/2009 | Lee | 310/312 |
| 2009/0189294 A1 | 7/2009 | Chang | |
| 2010/0020311 A1 | 1/2010 | Kirby | |
| 2010/0148803 A1 | 6/2010 | Ohnishi | |
| 2011/0107838 A1 | 5/2011 | Suijlen | |
| 2012/0000288 A1 | 1/2012 | Matsuura | |
| 2012/0212109 A1 | 8/2012 | Yamazaki | |
| 2012/0266682 A1 | 10/2012 | Torashima | |

FOREIGN PATENT DOCUMENTS

| | | |
|---|---|---|
| EP | 0461761 | 12/1991 |
| EP | 0 531 985 | 3/1993 |
| EP | 1055908 | 11/2000 |
| EP | 0971208 | 12/2000 |
| JP | 57-091017 | 6/1982 |
| JP | 401129517 | 5/1989 |
| JP | 04322507 | 11/1992 |
| JP | 5286142 | 11/1993 |
| JP | 06232678 | 8/1994 |
| JP | 6-318533 | 11/1994 |
| JP | 08330878 | 12/1996 |
| JP | 9-247025 | 9/1997 |
| JP | 2003-318685 A | 11/2003 |
| JP | 2005-180921 A | 7/2005 |
| JP | 2006-352487 | 12/2006 |
| KR | 10-2001-0110428 A | 12/2001 |
| WO | 84-00082 | 1/1984 |
| WO | 96/38710 | 12/1996 |
| WO | 98/15799 | 4/1998 |
| WO | 00/68640 | 11/2000 |
| WO | 01/44823 | 6/2001 |
| WO | 01/74708 | 10/2001 |
| WO | 02/12873 | 2/2002 |
| WO | 2005/121769 | 12/2005 |
| WO | 2006/010206 | 2/2006 |
| WO | 2006/103439 | 10/2006 |

OTHER PUBLICATIONS

White, Lan M., et al., Increasing the Enhancement of SERS with Dielectric Microsphere Resonators, Spectroscopy-Eugene, Apr. 2006.

Yan, Fei, et al., "Surface-enhanced Raman scattering (SERS) detection for chemical and biological agents," IEEE Sensors Journal, vol. 5, No. 4, Aug. 2005.

Cleland, A.N., et al., "Fabrication of High Frequency Nanometer Scale Mechanical Resonators From Bulk Si Crystals," applied Physics Letters, Oct. 28, 1996.

Greer, J.A., et al., "Properties of SAW resonators fabricated on quartz substrates of various qualities," Ultrasonics Symposium, 1994 IEEE, vol. 1, Nov. 1-4, 1994, pp. 31-36.

Lin, J.W., et al., "A Robust High-Q Micromachined RF Inductor for RFIC Applications," IEEE Transactions on Electronic Devices, vol. 52, No. 7, pp. 1489-1496 (Jul. 2005).

From U.S. Appl. No. 12/399,680 (now U.S. Patent No. 8,138,016), Application and Office Actions, including but not limited to the Office Action mailed on Jun. 7, 2011, Aug. 4, 2011, and Nov. 14, 2011.

From U.S. Appl. No. 13/363,174, Application and Office Actions.

Barbour et al., "Micromechanical Silicon Instrument and Systems Development at Draper Laboratory," AIAA Guidance Navigation and Control Conference, 1996, Paper No. 96-3709.

Burdess et al., "The Theory of a Piezoelectric Disc Gyroscope", Jul. 1986, IEEE vol. AES 22, No. 4; p. 410-418.

Fujita et al., "Disk-shaped bulk micromachined gyroscope with vacuum sealing," Sensors and Actuators A:Physical, vol. 82, May 2000, pp. 198-204.

Johnson et al., "Surface Micromachined Angular Rate Sensor," A1995 SAE Conference, Paper No. 950538, pp. 77-83.

Putty et al., "A Micromachined Vibrating Ring Gyroscope," Solid State Sensor and Actuator Workshop, Transducer Research Foundation, Hilton Head, 1994, pp. 213-220.

Skulski et al., "Planar resonator sensor for moisture measurements", Microwaves and Radar, 1998, Mikon '98, 12th International Conf., vol. 3, May 20-22, 1998, pp. 692-695.

Tang et al., "A Packaged Silicon MEMS Vibratory Gyroscope for Microspacecraft,"Proceedings IEEE, 10th Annual Int. Workshop on MEMS, Japan, 1997, pp. 500-505.

Tang et al., "Silicon Bulk Micromachined Vibratory Gyroscope," Jet Propulsion Lab.

Wright et al., "The HRG Applied to a Satellite Attitude Reference System," Guidance and Control, AASAAS, 1994, 86: pp. 55-67 (13 pages).

J.-M. Friedt and É. Carry, "Introduction to the quartz tuning fork", American Journal of Physics 75, 415 (2007), pages 415-422.

From U.S. Appl. No. 12/820,761, Office Action mailed on Nov. 19, 2013.

Abe,T., et al., "One-Chip Multichannel Quartz crystal microbalance (QCM) Fabricated by Deep RIE," Sensors and Actuators, 2000, pp. 139-143.

Aaltonen, T., et al., "ALD of Rhodium thin films from $Rh(acac)_3$ and Oxygen," Electrochemical and Solid-State Lett. 8, C99 (2005).

Evoy, S., et al., "Temperature-dependent Internal Friction in Silicon Nanoelectromechanical Systems," Applied Physics Letters, vol. 77, No. 15.

Park, K.J., et al., " Selective area atomic layer deposition of rhodium and effective work function characterization in capacitor structures," Applied Physics Letters 89, 043111 (2006).

\* cited by examiner

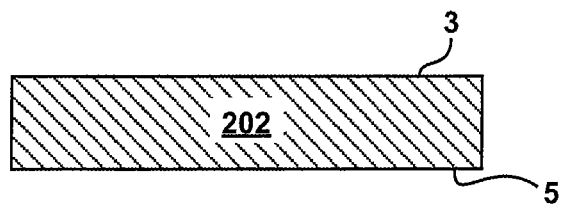
FIG. 1
FIG. 2A
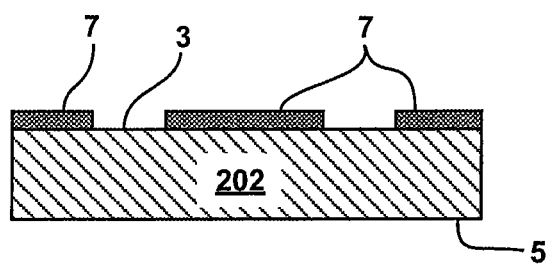
FIG. 2B
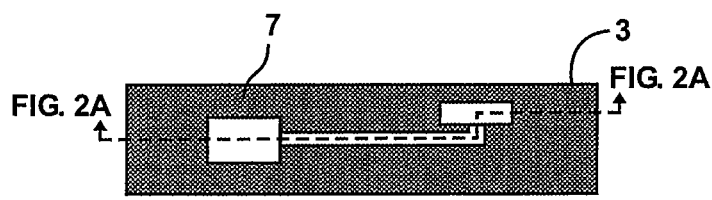
FIG. 3A
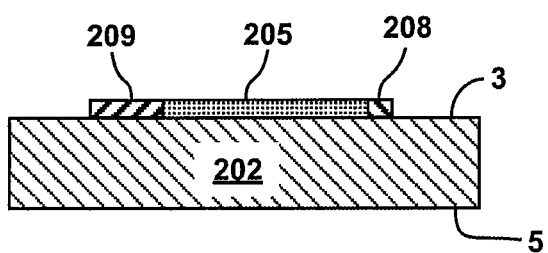
FIG. 3B
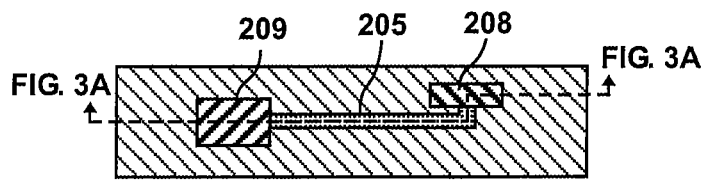

METHOD OF FABRICATION AN ULTRA-THIN QUARTZ RESONATOR

CROSS REFERENCE TO RELATED APPLICATION

This is a divisional application of U.S. patent application Ser. No. 12/034,852, filed on Feb. 21, 2008, which issued as U.S. Pat. No. 7,802,356 on Sep. 28, 2010, and which is incorporated herein as though set forth in full.

INCORPORATION BY REFERENCE

U.S. Pat. No. 7,237,315 to Kubena, et al. on Jul. 3, 2007, titled "Method for fabricating a resonator," is hereby incorporated by reference in its entirety.

STATEMENT REGARDING FEDERALLY SPONSORED RESEARCH OR DEVELOPMENT

The present invention was made with support from the United States Government under Grant number DAAB07-02-C-P613 awarded by Defense Advanced Project Agency (DARPA). The United States Government has certain rights in the invention.

BACKGROUND

1. Field of the Invention

This disclosure is generally related to resonators and in particular a method to manufacture an ultra thin quartz resonator components.

2. Description of Related Art

The use of quartz substrates in a MEMS process provides for the fabrication of high Q thermally compensated resonators. For thickness shear mode resonators, the thickness of the substrate determines its resonant frequency. The thinner the quartz substrate, the higher the resonant frequency. Therefore, by varying the dimensions of the substrate over a broad range, the resonant frequency can be adjusted over a broad range. The Q of a resonator is a measure of the frequency selectivity of a resonator and is related to how well the energy of the oscillations are trapped. One factor that influences how well the energy of the oscillations is trapped is the smoothness or planarity of the surface. When thinning a quartz substrate it is desirable to maintain a smooth undamaged surface to ensure a high Q. However, present quartz fabrication techniques for oscillators or filters do not allow the resonators to be integrated on a chip with other electronics. This is a significant contributing factor to the size and cost of a device. Using separate on chip components also contributes significantly to the size and cost of a device.

Furthermore, present quartz thinning processes have not be able to thin substrates to a thickness on the order of 10 micrometers or less, because of the inability to monitor the thickness of the quartz substrate in real time with sub micron resolution. Another difficulty is the handling of the quartz substrate after it has been thinned. One reference which discusses thinning quartz substrates is Takahsi Abe, Masayoshi, "One-Chip Multichannel Quartz crystal microbalance (QCM) Fabricated By Deep RIE," Sensors and Actuators, 2000, pp. 139 143. Having a quartz substrate with a thickness on the order of 10 microns or less can result in resonant frequencies greater than 100 MHz, which is desirable for high frequency applications. By combining several quartz based resonators having different resonant frequency, with a RF MEMS switch on the same chip, frequency hopping and filter reconfiguration can occur on the microsecond time scale. In frequency hopping and filter reconfiguration the desired frequency in a band of frequencies is selected by using the RF MEMS switch to activate the quartz resonator having a resonant frequency equal to the desired frequency. The spectral band for most radio frequency hopping and filter reconfiguration applications is 20 MHz to 3 GHz. The low frequency part of the band is extremely difficult to cover with conventional capacitive-based filters since capacitive-based filters are larger in size. Frequency hopping and filter reconfiguration applications would also benefit from temperature compensated, stable, high-Q (in the amount of about 10,000), small arrays of resonators which cover that spectral band.

MEMS devices which consist of silicon-based nanoresonators have been fabricated in an attempt to integrate nanoresonators or microresonators with other electronics. Nanoresonators and microresonators are resonators which have linear dimensions on the order of nanometers and micrometers, respectively. These silicon-based nanoresonators have shown resonant frequencies as high as 600 MHz, and Q's in the range of 1000-2000. However, the problem with silicon-based nanoresonators is that they have high electrical impedances and lower Q's. Two documents which discuss silicon-based nanoresonators are S. Evoy, A. Olkhovets, L. Sekaric, J. M. Parpia, H. G. Craighead, D. W. Carr, "Temperature-dependent Internal Friction in Silicon Nanoelectromechanical Systems," Applied Physics Letters, Vol. 77, Number 15, and A. N. Cleland, M. L. Roukes, "Fabrication of High Frequency Nanometer Scale Mechanical Resonators From Bulk Si Crystals," Applied Physics Letters, Oct. 28, 1996.

An alternative solution, is known which makes use of non-MEMS quartz resonators. Such resonators consist of shear strip individual resonators operating in ranges of about 10 MHz to about 1 GHz. These resonators are packaged as discrete devices and mounted as hybrids to other RF circuits. The problem with non-MEMS quartz resonators is that they are non-integrable, they have higher costs, and they are physically larger in size.

As a result, a new process for manufacturing a quartz-based nanoresonator is desired in order to solve all the aforementioned problems.

SUMMARY OF THE INVENTION

Embodiments of the present disclosure provide a system and method for making a resonator.

According to a first aspect, a method for manufacturing a resonator is disclosed, the method comprising: providing a handle substrate; providing a host substrate; providing a quartz substrate comprising a first surface opposite a second surface; applying an interposer film to the first surface of the quartz substrate; bonding the quartz substrate to the handle substrate wherein the interposer film is disposed between the quartz substrate and the handle substrate; thinning the second surface of the quartz substrate; removing a portion of the bonded quartz substrate to expose a portion of the interposer film; bonding the quartz substrate to the host substrate; and removing the handle substrate and the interposer film, thereby releasing the quartz substrate.

According to a second aspect, a method for manufacturing a resonator is disclosed, the method comprising: providing a handle substrate; providing a quartz substrate comprising a first surface opposite a second surface; applying an interposer film to the first surface of the quartz substrate; bonding the handle substrate to the interposer film; thinning the second surface of the quartz substrate; forming at least one metallized via in the quartz substrate; providing a base substrate; bonding the quartz substrate to the base substrate; and removing the handle substrate, thereby releasing the quartz substrate Other systems, methods, features, and advantages of the present disclosure will be, or will become apparent, to one having ordinary skill in the art upon examination of the following drawings and detailed description. It is intended that all such additional systems, methods, features, and advantages included within this description, be within the scope of the present disclosure, and be protected by the accompanying claims.

DESCRIPTION OF THE DRAWING(S)

Many aspects of the disclosure can be better understood with reference to the following drawings. Components in the drawings are not necessarily to scale, emphasis instead being placed upon clearly illustrating principles of the present disclosure. Moreover, in the drawing, like-referenced numerals designate corresponding parts throughout the several views.

FIG. 1 shows a quartz substrate, handle substrate and host substrate, to be used in accordance with the present application;

FIG. 2A shows a side view of the quartz substrate with photoresist;

FIG. 2B shows a top view of the quartz substrate with photoresist;

FIG. 3A shows a side view of the first surface of the quartz substrate with first electrode, an interconnect trace and an interconnect pad;

FIG. 3B shows a top view of the quartz substrate with first electrode, an interconnect trace and an interconnect pad;

DETAILED DESCRIPTION

Figure 4:
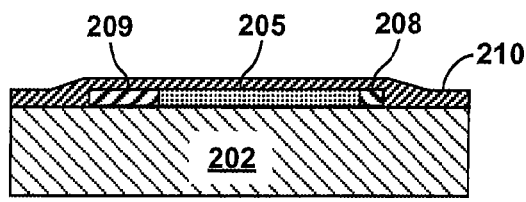
FIG. 4 shows a side view of the quartz substrate with an interposer film.

The present disclosure relates to a system and method for making a quartz layer for use in a quartz resonator. Specifically, the system and method may be used to make a quartz resonator, for example, for software programmable radios, chip-scale atomic clocks, X-band radars, chemical/biological warfare agent detection, and multi-band cellular phones.

A method of fabricating a quartz resonator according to the present disclosure will now be described with reference to FIGS. 1-18. A quartz layer/substrate 202 having a first surface 3 and a second surface 5, a handle layer/substrate 204, and a host layer/substrate 206 are provided as shown in FIG. 1. The handle substrate 204 may be comprised of a group III-V material, Si or SiGe.

The first surface 3 of the quartz substrate 202 is then patterned and metallized using, for example, a lift-off technique. In the lift-off technique, a thin layer of photoresist 7 is patterned on the first surface 3 of the quartz substrate 202, as shown in side view FIG. 2A and top view FIG. 2B. Using lithography, photoresist is removed in the regions where metallization is desired. The metal is then deposited on the photoresist 7 and in the regions where the photoresist 7 was removed. The photoresist is then removed leaving metal only in the desired regions on the first surface 3 of the quartz substrate 202 as shown in side view FIG. 3A and top view FIG. 3B. During patterning and metallizing a first electrode 209 is deposited on the first surface 3 of the quartz substrate 202. The first electrode 209 may be comprised of a combination of Al, Ti/Au or Cr/Au, deposited in that order on the quartz layer 202. Additionally, an interconnect trace 205 and an interconnect pad 208 may also be formed on the quartz layer 202. The interconnect trace 205 and the interconnect pad 208 may be comprised of the same material as the first electrodes 209 or may comprise, for example, Ti/Pt/Au or Cr/Pt/Au. The purpose of the first electrode 209, the interconnect trace 205 and the interconnect pad 208 will be discussed later. The first electrode 209 may have a thickness of, for example, about 200 Å to about 1000 Å. The interconnect trace 205 and the interconnect pad 208 may have a thickness of, for example, about 1000 Å to about 5000 Å. In one exemplary embodiment, the first electrode 209 may be deposited on the quartz layer 202 either before or after deposition of the interconnect trace 205 and/or the interconnect pad 208.

Figure 5:
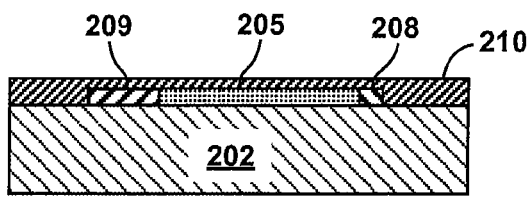
FIG. 5 shows a side view of the quartz substrate with planarized interposer film.

An interposer film 210 is deposited on the quartz layer 202 to cover the first electrode 209, the interconnect trace 205 and the interconnect pad 208 as shown in side view FIG. 4. The interposer film 210 may be, for example, an amorphous silicon film, a polyimide material, a resist material or any other material that is bondable, able to be planarized and be removed during processing. To avoid non-planarity due to a presence of the first electrode 209, the interconnect trace 205 and the interconnect pad 208, the interposer film 210 may be planarized as shown in FIG. 5. Planarization of the interposer film 210 may be accomplished by a chemical-mechanical-planarization (CMP) process.

Figure 6:
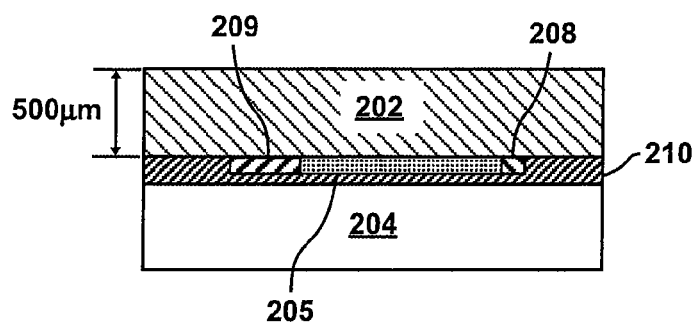
FIG. 6 shows a side view of the planarized interposer film bonded to the handle substrate.
Figure 7:
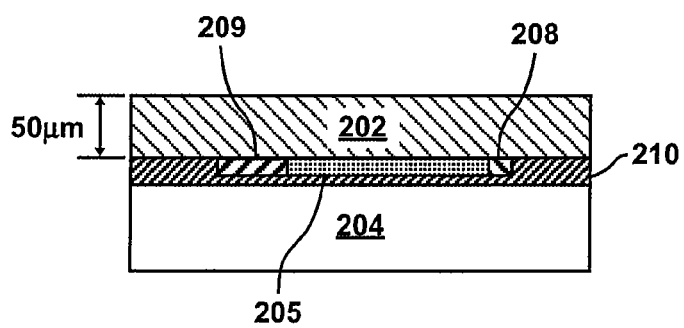
FIGS. 7-9 show the thinning of the quartz substrate while bonded to the handle substrate.

After planarization of the interposer film 210, the handle layer 204 may be bonded to the interposer film 210 as shown in side view FIG. 6. For example, the bonding may be performed using an EV 501 Wafer Bonder, which is commercially available or other similar processes and devices. To wafer bond the handle layer 204 to the interposer film 210, the handle layer 204 and the interposer film 210 are thoroughly cleaned in a megasonic cleaning system, which makes use of ultrasonic waves to remove particle contaminants. After the handle layer 204 and the interposer film 210 are cleaned, they are brought in contact with each other. The contact between the handle layer 204 and the interposer film 210 creates a bond due to the well known van der Waals force. The first electrodes 209, the interconnect trace 205 and the interconnect pad 208 are now sandwiched between the handle layer 204 and the interposer film 210. Other interposer layers such as resist, polymide, glue, etc. may also be used instead of interposer film 210 as long they can be removed at low temperatures.

After the bonding process, the quartz layer 202 undergoes a thinning process (FIGS. 6-9). In order to thin the quartz layer 202, the following method may be used. For exemplary purposes only, the quartz layer 202 has an initial thickness of about 500 micrometers as shown in side view FIG. 6. A first portion of the quartz layer 202 may be removed by thinning the quartz substrate from about 500 micrometers to about 50 micrometers as shown in side view FIG. 7 using, for example, a mechanical lapping and polishing system or wafer grinding. Lapping and polishing systems are well known and commercially available from manufacturers such as Logitech. In a mechanical lapping and polishing system, a polishing head is spun at a high rate of speed. The lapping and polishing system also comprises a nozzle for dispensing slurry on the quartz layer 202. While spinning, the polishing head contacts the quartz layer/substrate in the presence of the slurry, thereby evenly grinding away portions of the quartz layer/substrate 202. The slurry may be comprised of chemicals such as aluminum oxide to remove quartz from the quartz substrate 202.

Figure 8:
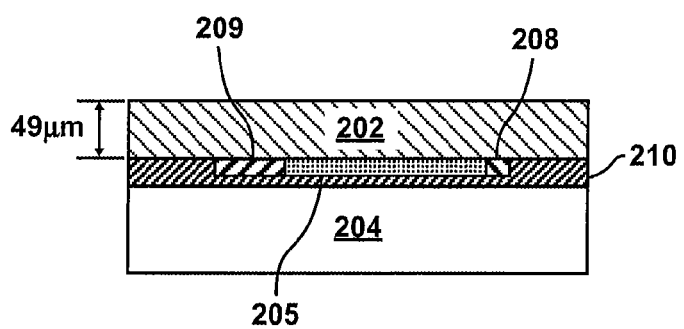

Next, a second portion of about 1 micrometer of quartz is removed from the quartz substrate 202 as shown in side view FIG. 8 to ensure a smooth surface. This may be done with the above described mechanical lapping and polishing system, except a softer chemical such as colloidal silica or cerium oxide is used in the slurry to remove quartz from the quartz substrate 202. Alternatively, chemical-mechanical polishing (CMP) can be used to polish the quartz substrate 202 and remove damage.

Figure 9:
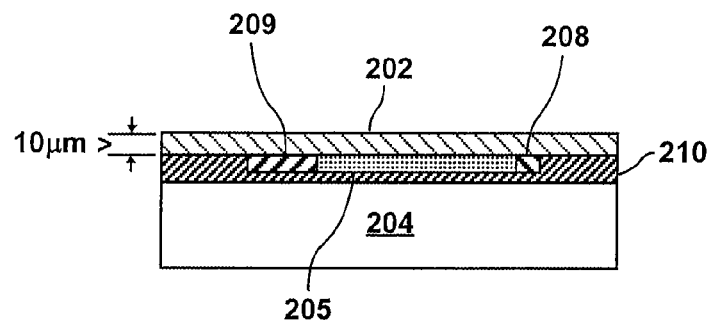
Figure 10:
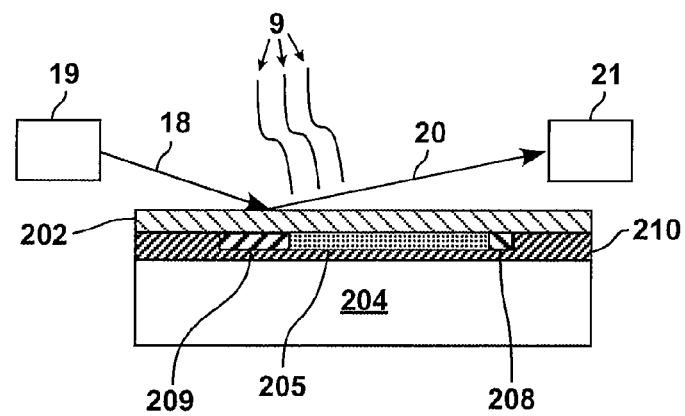
FIGS. 10 and 11 show two methods used to monitor the thickness of the quartz substrate while being thinned.
Figure 11:
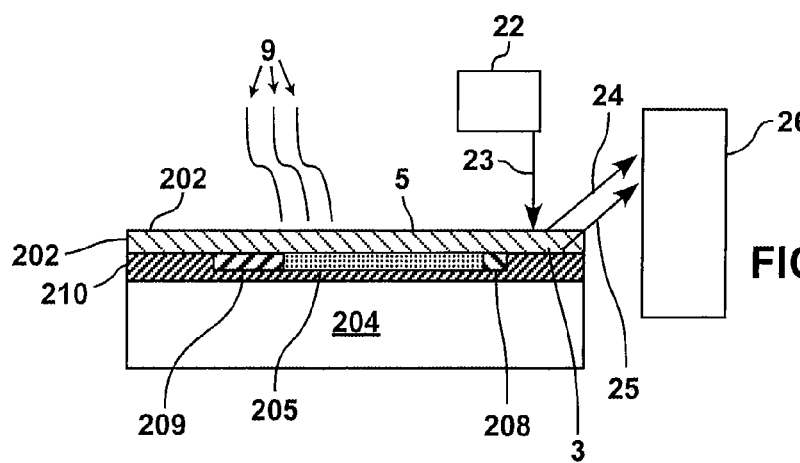

Next, a third portion of the quartz substrate 202 may be removed to reduce the thickness of the quartz substrate 202 to less than 10 micrometers as shown in side view FIG. 9 using, for example, reactive ion etching (RIE) with $CF_4$ or $SF_6$ gas 9 as shown in side view FIGS. 10-11. While being thinned in the RIE machine, the thickness of quartz substrate 202 may be simultaneously monitored using spectropic ellipsometry or reflectometry techniques as shown in side view FIGS. 10-11. In spectroscopic ellipsometry, shown in side view FIG. 10, a beam of white light 18 from a source 19 is shone onto the quartz substrate 202 at an angle of about 15° off horizontal. The white light has a known polarization. The reflected white light 20 off the quartz substrate 202 will have a different polarization which is directly related to the thickness of the quartz substrate 202. A receiver 21 receives the reflected white light 20 and calculates the change in polarization. The change in polarization is directly proportional to the thickness of the quartz substrate 202. In reflectometry, shown in FIG. 11, a laser source 22 shines light 23, with a known wavelength, onto the second surface 5 of the quartz substrate 202 at an angle of 90° off horizontal as shown in side view FIG. 11. A first reflected beam 24 is reflected off the second surface 5 of the quartz substrate 202. A portion of the incident light also penetrates through the quartz substrate 202. This creates a second reflected beam 25 that is reflected off the first surface 3 back through the quartz substrate 202 and out the second surface 5. The first reflected beam 24 and second reflected beam 25 are parallel to each other and are received by a receiver 26 which determines whether the first reflected beam 24 and the second reflected beam 25 add constructively or destructively. If the first and second reflected beams 24, 25 add constructively, the thickness of the quartz substrate is equal to 50% of the ratio of the incident light wavelength divided by the refractive index of quartz, or an integer multiple thereof, such as 100%, 150%, etc. The refractive index of quartz is typically about 1.46. If the first and second reflected beams 24, 25 add destructively, the thickness of the quartz substrate 202 is equal to 25% of the ratio of the incident light wavelength divided by the refractive index of quartz, or an odd integer multiple thereof, such as 75%, 125%, etc.

After using RIE to remove quartz from the quartz substrate 202, the surface of the quartz substrate 202 may have imperfections that may need to be corrected. This can be done by using the mechanical lapping and polishing system described above with a chemical such as silica or cerium oxide, to remove about 0.01 to about 0.02 micrometers of quartz, followed up with a wet etch in ammonium bifluoride to remove about 0.005 micrometers of quartz from the quartz substrate 202 as shown in side view FIG. 9. This additional step will help ensure a polished, defect free quartz substrate 202.

Figure 12:
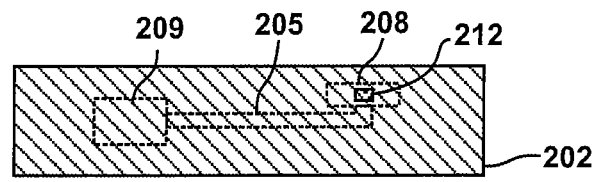
FIG. 12 shows a top view of the quartz substrate with a via.

After the quartz substrate 202 is thinned, via 212 is etched and metallized through the quartz layer 202 as shown in top view FIG. 12. Doted lines in top view FIG. 12 represent the first electrode 209, the interconnect trace 205 and interconnect pad 208 that are disposed on the side 3 of the quartz substrate 202. The via 212 may be created using lithography techniques well known in the art. The via 212 is etched and metallized above the interconnect 208 and is electrically connected with the interconnect pad 208.

Figure 13:
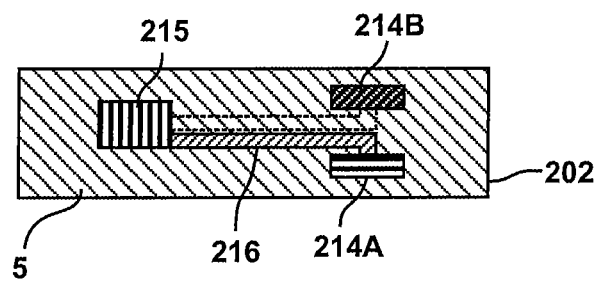
FIG. 13 shows a top view of the second surface of the quartz substrate having a second electrode, interconnect trace and interconnect pads.

Once the via 212 is fabricated, the side 5 of the quartz substrate 202 is patterned and metallized using the lift-off technique to form at least one second electrode 215 as shown in the top view FIG. 13. The second electrode 215 may be comprised of a combination of Al, Ti/Au or Cr/Au, deposited in that order on the side 5 of the quartz substrate 202. Additionally, an interconnect trace 206 and interconnect pads 214A and 214B may also be formed on the side 5 of the quartz layer 202. The interconnect pad 214A is electrically connected to the second electrode 215 through the trace 216 as shown in top view FIG. 13. The interconnect pad 214B may be electrically connected to the interconnect pad 208 though the via 212 as shown in the side view FIG. 14A. The interconnect trace 216 and interconnect pads 214A and 214B may be comprised of the same material as the second electrode 215 or may comprise, for example, Ti/Pt/Au or Cr/Pt/Au.

Figure 14A:
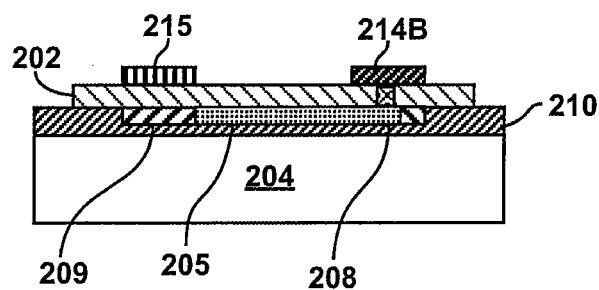
FIG. 14A shows a side view wherein a portion of the quartz substrate has been removed.
Figure 14B:
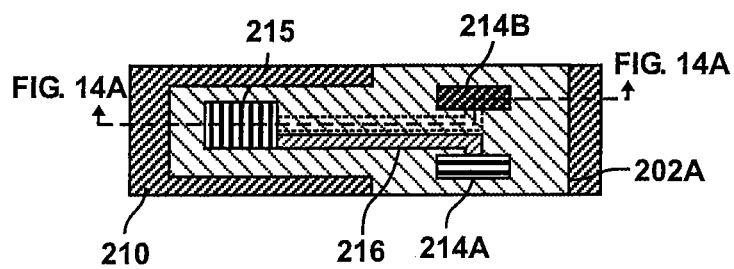
FIG. 14B shows a top view wherein a portion of the quartz substrate has been removed.

Once the electrode 215, the interconnect trace 216 and the interconnect pads 214A and 214B have been deposited, a portion of the quartz substrate 202 is removed to expose a portion of the interposer film 210, thereby creating a modified quartz substrate 202A as shown in side view FIG. 14A and top view FIG. 14B. Such portion may be removed using lithography and REI techniques well known in the art to divide the quartz substrate into individual devices and determine the desired dimensions of the quartz substrate 202.

The first and second electrodes 209, 215 on the modified quartz substrate 202A allow the resonant frequency of the quartz substrate 202A to be adjusted. By ablating a portion of the first and second electrodes 209, 215, the resonant frequency of the quartz substrate 202A can be adjusted. The first and second electrodes 209, 215 can be ablated using known techniques such as ion beam milling or laser ablation.

Figure 15:
FIG. 15 shows a portion of the base substrate having been removed.
Figure 16:
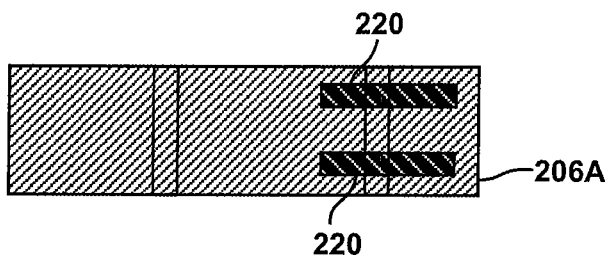
FIG. 16 shows a top view of the base substrate with probe pads.

As already mentioned above with reference to the detailed description of FIG. 1, a host substrate 206 is provided. The host substrate 206 may be comprised of a group III-V material or SiGe. Side view FIG. 15 shows a modified host substrate 206A, where a portion of the host substrate 206 shown in FIG. 1 has been removed. The removal of a portion of the host substrate 206 may be done using lithography techniques well known in the art. At least two probe pads 220 may be deposited on the modified host substrate 206A as shown in top view FIG. 16. The probe pads 220 may be deposited using the same lift off technique used to deposit the at least one first electrode 209 discussed previously. The probe pads 220 may be comprised of a gold/germanium alloy, nickel, and gold deposited in that order.

Figure 17:
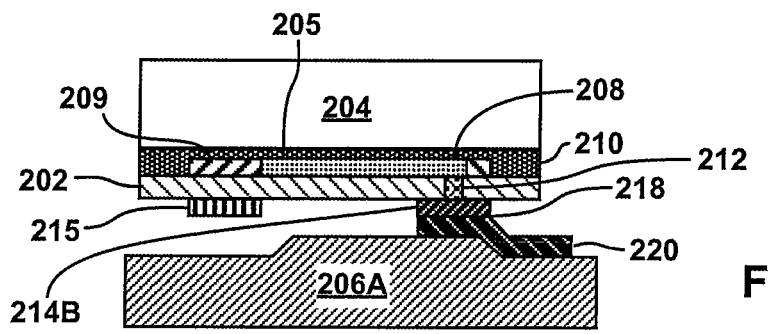
FIG. 17 shows a side view of the bond between the probe pads of the base substrate and the interconnect pads on the second surface of the quartz substrate.

After the probe pads 220 have been deposited on the modified host substrate 206A, the interconnect pads 214A and 214B of the modified quartz substrate 202A are bonded with, for example, bond metal to the probe pads 220 along bonding line 218 as shown in side view FIG. 17 using, for example, an Au—Au compression bonding scheme. In the Au—Au compression bonding scheme, the quartz substrate 202A, the interconnect pads 214A and 214B, the probe pads 220, and the modified base substrate 206A are heated to a temperature greater than 300° C. in a vacuum having a pressure no greater than $10^{-4}$ Torr. Then the interconnect pads 214A and 214B and probe pads 220 are pressed together, while depressurized, with a pressure of approximately 1 MPa. This will fuse the probe pads 220 and the interconnect pads 214A and 214B together as shown in side view FIG. 17. In one example, the bond metal may comprise, for example, Ti/In or Ti/Sn.

Figure 18A:
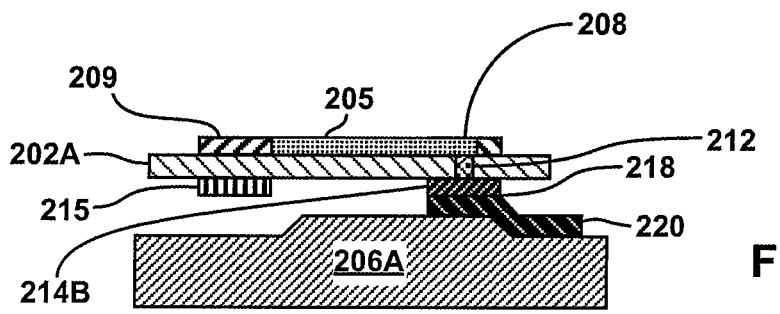
FIG. 18A-18B shows a side and top view of the bond between the probe pads of the base substrate and the interconnect pads on the second surface of the quartz substrate and release of handle wafer and removal of the interposer layer.
Figure 18B:
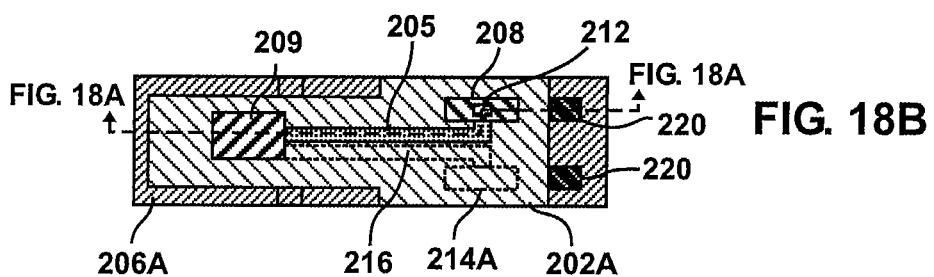

The above described bonded structure provides electrical access from one of the probe pads 220 to the electrode 215 through the interconnect pad 214A and the interconnect trace 216. The above described bonded structure also provides electrical access from the other probe pad 220 to the electrode 209 through the interconnect pad 214B, the via 212, the interconnect pad 208 and the interconnect trace 205. After the interconnect pads 214A and 214B have been bonded to the probe pads 220, the handle substrate 204 and film 210 may be removed from the remaining structure, using a combination of wet and dry etches so that a structure like the one shown in the side view FIG. 18A and top view FIG. 18B is obtained.

The purpose of the first and second electrodes 209, 215 is to receive an electrical signal from the probe pads 220 which can bias or drive the modified quartz substrate 202A with an electric field. The electrical signal is preferably an AC signal. When the electrical signal is received by the first and second electrodes 209, 215 a strain signal is placed on the modified quartz substrate 202A. When the frequency of this strain signal matches the mechanical resonant frequency of the modified quartz substrate 202A, thereby causing the modified quartz substrate 202A to oscillate at its resonant frequency, a large signal is produced on the electrodes 209, 215 by the well-known piezoelectric effect.

As used in this specification and appended claims, the singular forms "a," "an," and "the" include plural referents unless the specification clearly indicates otherwise. The term "plurality" includes two or more referents unless the specification dearly indicates otherwise. Further, unless described otherwise, all technical and scientific terms used herein have meanings commonly understood by a person having ordinary skill in the art to which the disclosure pertains.

As a person having ordinary skill in the art would appreciate, the elements or blocks of the methods described above could take place at the same time or in an order different from the described order.

The foregoing detailed description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "step(s) for . . . "

The invention claimed is:

1. A method for fabricating a resonator comprising:
   receiving a handle substrate;
   receiving a quartz substrate comprising a first surface opposite a second surface;
   applying an interposer film to the first surface of the quartz substrate;
   bonding the handle substrate to the interposer film;
   thinning the second surface of the quartz substrate;
   forming at least one metallized via in the quartz substrate;
   receiving a host substrate;
   bonding the quartz substrate to the host substrate; and
   removing the handle substrate, thereby releasing the quartz substrate.

2. The method of claim 1, the method further comprising:
   forming a first electrode on the first surface;
   forming a first interconnect pad on the first surface electrically connected to the first electrode;
   forming a second electrode on the second surface of the quartz substrate; forming a second interconnect pad on the second surface electrically connected to the second electrode; and
   forming a third interconnect pad on the second surface electrically connected to the first interconnect pad.

3. The method of claim 2, wherein the first electrode and the second electrode formed on the quartz substrate comprise Al, Ti/Au or Cr/Au.

* * * * *